(12) United States Patent
Nicolai et al.

(10) Patent No.: US 10,206,311 B2
(45) Date of Patent: Feb. 12, 2019

(54) COOLING CIRCUIT SYSTEM, IN PARTICULAR TO BE USED IN A DATA CENTER, AND CONTROLLING METHOD THEREOF

(71) Applicant: RITTAL GMBH & CO. KG, Herborn (DE)

(72) Inventors: Michael Nicolai, Rabenau (DE); Dieter Becker, Eschenburg (DE); Dirk Hemann, Greifenstein (DE); Martin Doerrich, Mittenaar (DE)

(73) Assignee: Rittal GmbH & Co. KG, Herborn (DE)

( * ) Notice: Subject to any disclaimer, the term of this patent is extended or adjusted under 35 U.S.C. 154(b) by 152 days.

(21) Appl. No.: 13/261,845

(22) PCT Filed: Oct. 2, 2012

(86) PCT No.: PCT/EP2012/004129
§ 371 (c)(1),
(2) Date: Apr. 16, 2014

(87) PCT Pub. No.: WO2013/056787
PCT Pub. Date: Apr. 25, 2013

(65) Prior Publication Data
US 2014/0240917 A1    Aug. 28, 2014

(30) Foreign Application Priority Data

Oct. 21, 2011   (DE) .................. 10 2011 054 704
Oct. 21, 2011   (DE) .................. 10 2011 122 824
Aug. 15, 2012   (DE) .................. 10 2012 107 473

(51) Int. Cl.
*H05K 7/20*        (2006.01)

(52) U.S. Cl.
CPC ..... *H05K 7/20736* (2013.01); *H05K 7/20718* (2013.01); *H05K 7/20745* (2013.01); *H05K 7/20781* (2013.01); *H05K 7/20836* (2013.01)

(58) Field of Classification Search
None
See application file for complete search history.

(56) References Cited

U.S. PATENT DOCUMENTS 6,374,627 B1 *   4/2002   Schumacher ........ H05K 7/2079
                                                165/104.33
6,616,524 B2     9/2003   Storck, Jr. et al.
(Continued)

FOREIGN PATENT DOCUMENTS

CN          102105033 A      6/2011
DE       202009015124 U1     3/2010
(Continued)

*Primary Examiner* — Courtney Smith
(74) *Attorney, Agent, or Firm* — Marshall & Melhorn, LLC

(57) ABSTRACT

The invention relates to a cooling circuit system, comprising a plurality of juxtaposed racks; a double bottom consisting of double bottom elements mounted on a base bottom on which double bottom the racks are mounted; electric or electronic components to be cooled, which components are accommodated in the racks; and a cooling system, the components of which are accommodated in the double bottom, wherein the cooling system comprises fans that are connected in parallel and that blow cooled air from the double bottom towards the juxtaposed racks. The invention relates also to a method of controlling a cooling circuit system of that type.

15 Claims, 13 Drawing Sheets

(56) References Cited

U.S. PATENT DOCUMENTS

| | | |
|---|---|---|
| 6,772,604 B2 | 8/2004 | Bash et al. |
| 6,775,997 B2 | 8/2004 | Bash et al. |
| 6,832,489 B2 | 12/2004 | Bash et al. |
| 6,832,490 B2 | 12/2004 | Bash et al. |
| 6,834,512 B2 | 12/2004 | Bash et al. |
| 6,854,284 B2 | 2/2005 | Bash et al. |
| 6,868,683 B2 | 3/2005 | Bash et al. |
| 6,881,142 B1 | 4/2005 | Nair |
| 6,945,058 B2 | 9/2005 | Bash et al. |
| 7,315,448 B1* | 1/2008 | Bash ............... H05K 7/2079 165/80.3 |
| 7,826,216 B2* | 11/2010 | Moss ............. H05K 7/20736 361/679.48 |
| 8,472,182 B2* | 6/2013 | Campbell ........ H05K 7/20781 361/679.49 |
| 2006/0168975 A1 | 8/2006 | Malone et al. |
| 2009/0156114 A1* | 6/2009 | Ahladas .......... H05K 7/20745 454/184 |
| 2009/0168345 A1* | 7/2009 | Martini ............ F24F 11/0001 361/691 |
| 2009/0277605 A1* | 11/2009 | VanGilder ........ H05K 7/20745 165/67 |
| 2010/0263830 A1* | 10/2010 | Noteboom ......... H05K 7/2079 165/80.2 |
| 2011/0105010 A1* | 5/2011 | Day ................ H05K 7/20754 454/184 |
| 2011/0223085 A1 | 9/2011 | Kelkar et al. |
| 2011/0307102 A1 | 12/2011 | Czamara et al. |
| 2012/0057298 A1* | 3/2012 | Wei ................ H05K 7/20754 361/679.49 |
| 2013/0199032 A1 | 8/2013 | Czamara et al. |
| 2013/0201618 A1 | 8/2013 | Czamara et al. |
| 2013/0260666 A1* | 10/2013 | Rodriquez ........ H05K 5/0213 454/184 |

FOREIGN PATENT DOCUMENTS

| | | |
|---|---|---|
| WO | 2009109296 A1 | 9/2009 |
| WO | 2011038348 A1 | 3/2011 |

* cited by examiner

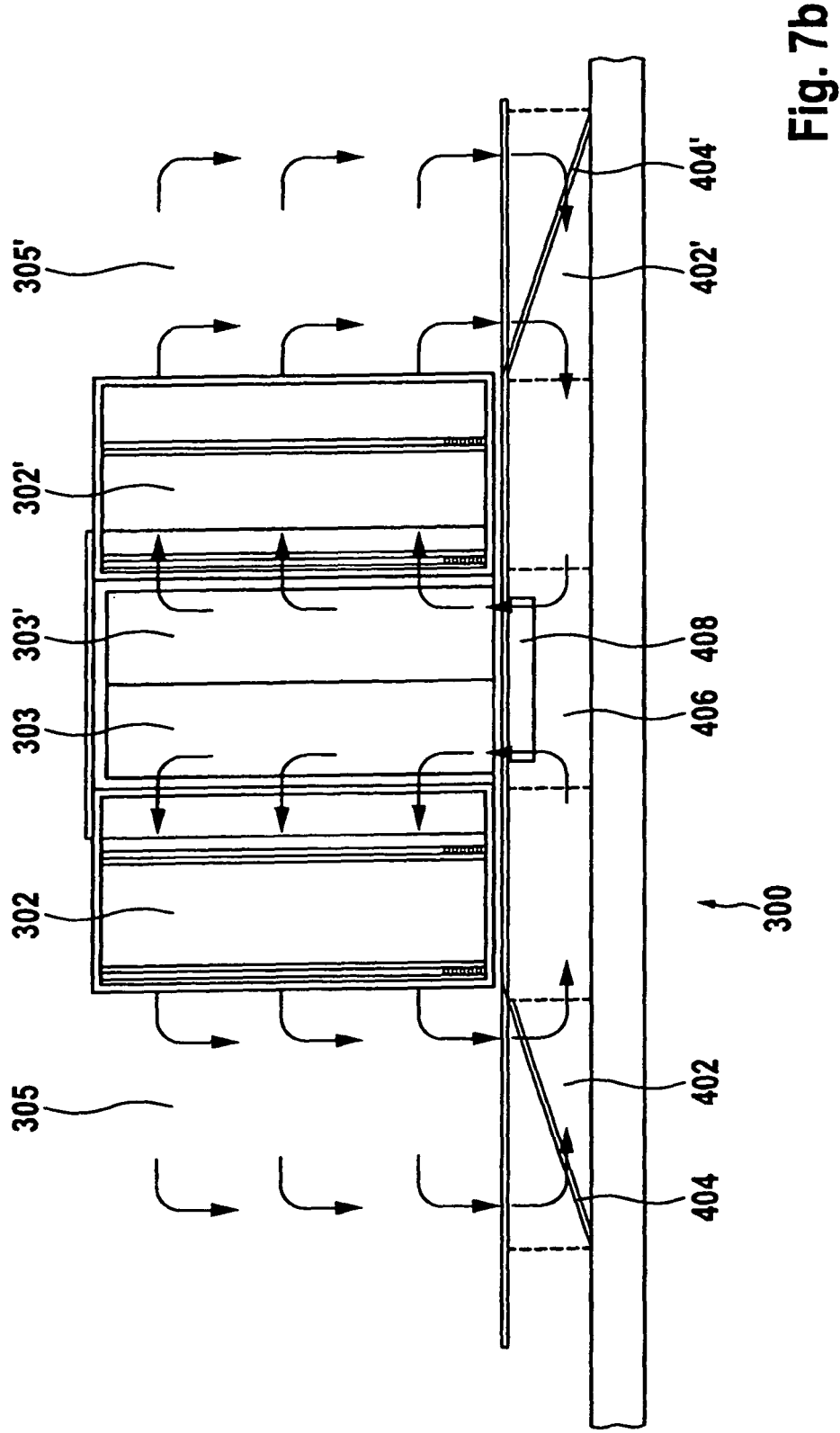

COOLING CIRCUIT SYSTEM, IN PARTICULAR TO BE USED IN A DATA CENTER, AND CONTROLLING METHOD THEREOF

BACKGROUND OF THE INVENTION

The invention relates to a cooling circuit system, in particular to be used in a data center. Moreover, the invention relates to a controlling method for a cooling circuit system. Electric or electronic components to be cooled, which are located on a double bottom, are cooled with the aid of a cooling system, wherein fans blow cooled air from the double bottom, as described in US 2005/0075065 A1.

Many organizations or enterprises use their own data center to execute their computer-intensive working steps. Data centers of all magnitudes are individually planned in these days, where necessarily continually recurring actions are repeated for each new data center, incurring an unnecessary cost already in a planning stage. In order to reduce manufacturing requirements on the spots, data centers or parts of data centers are pre-assembled according to user's needs and transported to the place of destination, so that operational readiness can be ensured within relatively short terms. Data centers of this type are also referred to as modular data centers.

Normally, data centers include a large number of servers, network and computer equipment to process, to store and to exchange data according to need. Typically many server racks are installed within a computer area in which servers and associated equipment is accommodated.

According to the size of a data center, a large amount of electric energy may be required to operate the facilities. Generally, a relatively high voltage is fed in which is down transformed to a lower voltage. A network comprising cabling, terminals and energy distribution is used to deliver the energy having the lower voltage to numerous specific components within the data center. Those components produce waste heat in a significant scale which must be dissipated, so that air conditioning is required.

Evaluation assessment is the power use effectiveness (PUE) defined by "The Greed Grid" consortium which represents the ratio of energy input of the computers to total energy consumption of a data center. Ratios below 1.3 are seen to by highly efficient.

Another problem in a data center is physical protection against e.g. fire, smoke, water and other risks, which could impair the servers in the data center or could destroy them more or less.

The amount of computing capacity in a data center may vary quickly, when business conditions change. Often, there is a need of increased computing capacity at a place, where existing components must be considered when planning the expansion as desired by the client. Extending existing capacity is, however, resource intensive and takes a long time. Cables must be laid, racks assembled and air condition systems must be built. Additional time is spent to perform inspections and to call for certification. Scaling is thus an important argument for the client already when newly constructing a data center.

The company Silicon Graphics International Corp., Fremont, Calif., U.S.A., distributes a modular data center made up in container architecture, in which up to four server racks are included in one unit, wherein the data center may be scaled up to 80 racks. The air conditioning and cooling system operates by using intelligent fans and a three-step fan evaporation cooling system with high energy efficiency.

The idea of a modular data center is also subject of WO 2011/038348 A1. A modular computing system for a data center includes one or more data center modules having server systems which are organized in racks. A central electric module supplies electric energy to the data center modules. Cooling modules using air are individually associated to each data center module and include optionally a fan. Air-conditioning uses pre-cooled air, which is introduced into the data center modules. Further, a fire protection system is included, which seals off the electrical modules in case of a fire. The modules of a system may be pre-assembled, wherein functional elements and structural elements are included. Those may be transported as a unit and may be quickly mounted at a desired place.

For all known data centers, also for modular data centers, a disadvantage of individual planning in particular when upgrading existing data centers exists, wherein efficiency considerations can be introduced only insufficiently.

Servers and racks of a data center are, as is the technique of the infrastructure, such as current and climate, built up on a second floor, mounted on a base bottom, all together named as a double bottom. Presently, the main objective when air-conditioning a data center is the guaranteed supply with cold air. For example, circulating air climatic systems are used which blow cold air into the space between the bottoms, wherein this cold air is sucked in by the servers through particularly designed plates from the double bottom. Hot outlet air is output at the rear side of the racks and is sucked in by the circulating air climatic system which cool down the air and supply the cooled air in a circuit to the servers again though the double bottom. Energy efficiencies play a subordinate role. Often, the double bottom accommodates the installation of energy supply and network cabling. A double bottom system is for example described in WO 2009/109296 A1.

DE 20 2009 015 124 U1 describes a system for cooling electric and electronic components and module units in device cabinets which are for example disposed in a data center. It may be provided that a cooling unit with fans is positioned in a double bottom below a rack, where the fans are separated in terms of air circulation. Each fan is associated with a means for preventing recirculation which is, with respect to the air flow direction, downstream to the relevant fan.

US 2005/0075065 A1 which was mentioned above and US 2004/0065097 A1 rely on a cooling circuit system which circulates the entire air within the data center.

SUMMARY OF THE INVENTION

It is the object of the present invention to provide a cooling circuit system by means of which air-conditioning may be optimized in terms of energy efficiency and which may be easily upgraded and retrofitted.

This object is solved by a cooling circuit system of claim 1. Alternatives are given in claims 5 to 7. A corresponding controlling method is subject matter of claim 12. Preferred embodiments are subject matter of respective referencing subclaims.

A cooling circuit system according to the present invention comprises a plurality of juxtaposed racks, a double bottom consisting of double bottom elements, mounted on a base bottom on which double bottom the racks are mounted, electric or electronic components to be cooled which components are accommodated in the racks and a cooling system, the components of which are accommodated in the double bottom, wherein the cooling system comprises fans, that are connected in parallel and blow cooled air from the double bottom towards the juxtaposed racks. Alternative arrangements are addressed below. It is also conceivable that the cooling design is applied to a single rack on a partial double bottom.

Use of racks for accommodating electric or electronic components to be cooled, for example servers, has the essential advantage that the device or system curve describing the mutual dependency of volume flow and pressure increase of flow though the device or system respectively, remains comparatively flat, so that the arrangement shows a comparably low flow resistance. Thus, it is possible to use parallel connected fans in an efficient manner and to operate in particular the fans with low power, i.e. with low number of revolutions. While the volume flow varies proportional to the number of revolutions, power consumption of the fan is proportional to the third power of the number of revolutions, so that a great potential for energy saving is created. It is not compulsory that each rack is associated with one fan. The underlying concept of the invention consists in that this space in front of the servers as a whole is kept cool, so that by parallel connection of the fans operation in a low power range may be performed.

By intelligent arrangement of the components, optionally supported by air baffles or the like, it is supported, that pressure losses within the arrangement remain minimum.

Accommodation of all components of the cooling system in the double bottom of the cooling circuit system allows, as will be explained later on, an improved concept of using premises wherein the air volume to be cooled is kept comparatively small, so that again it may be worked with lower fan power. The small air volume moreover offers advantages for a possibly required dehumidification.

Preferably it is also provided that the plurality of juxtaposed racks separates a cold aisle from a hot aisle and the fans are arranged in the double bottom elements of the cold aisle. Consistent separation of hot and cold air, combined with intelligent control, are indispensable pre-requisites for realizing highest cooling loads and efficiencies.

According to an advantageous embodiment, the fans are axial fans which show a particularly favorable fan characteristic.

Advantageously it is further provided, that the cooling system includes at least one heat exchanger which is accommodated in one or in a plurality of double bottom elements below at least one rack or in double bottom elements of the hot aisle.

With a fitting design of the heat exchanger, the fans in the double bottom can dispensed with partly or totally, as long as the fans of the electric or electronic components are included into the climate concept.

The cooling circuit system is optimized when a heat exchanger is obliquely arranged in one or in a plurality of double bottom elements such that a transversely extending edge of the heat exchanger is positioned close to the rack and the opposite transversely extending edge is positioned close to the base bottom. As a consequence, more space for the heat exchanger is provided resulting in higher power or lower pressure loss, respectively.

According to a preferred embodiment the heat exchangers are water-water heat exchangers. By accommodation in the double bottom an endangerment of the electrical system is excluded even in case of leakage.

It is advantageous that the piping for the at least one heat exchanger is accommodated in double bottom elements of the hot aisle.

It is particularly useful that at least a portion of the double bottom elements is designed as a covered frame in which one or a plurality of components of the cooling system is pre-assembled. For example, a fan may be mounted in a double bottom element in advance, wherein the cover is formed as a grid.

In a method of controlling a cooling system in a cooling circuit system, as described above, the fan performance is controlled such that the air flow volume in the cooling system corresponds to the air flow volume in the region of the racks.

If the cooling system comprises at least one heat exchanger, it is advantageous that the water inlet temperature of a heat exchanger is maintained above a dew point thereof, in order to avoid condensate formation. In such an arrangement, further components, such as a condensate drip tray, may be omitted.

Since according to the invention only relatively small air volumes are circulated, the inlet temperature may be reduced below the dew point during a relatively short controlling period, if it is necessary to dehumidify the air volume. If required, the air volume flow may be adjusted during the controlling period. Having this control, elaborate and maintenance-intensive humidification and dehumidification systems can be omitted which would only load the energy balance.

The control system processes signals from temperature and/or humidity sensors which are, as required, mounted in the premises of the data center, the racks and the double bottom.

The invention shows optimum benefits if it is used in a data center defined by a modular designed principle which is based on standardized building blocks. In particular, a data center of this type includes at least

- at least one server cell for receiving one or a plurality of servers, wherein each server cell is built up of building blocks which are taken from a first set of building blocks,
- at least one supply cell associated with at least one server cell, wherein the supply cell provides power, cooling, network connection and safety technology, wherein each supply cell is built up of building blocks which are taken from a second set of building blocks, and
- at least one central cell serving for connecting power cables, telecommunication cables and fluid ducts from and into the outer environment and which is associated with at least one supply cell, wherein each central cell is built up of building blocks which are taken from a third set of building blocks, wherein the building blocks of the first set of building blocks are configured such that each building block can be coupled in a unique manner to a pre-defined building block of the first set of building blocks or to a pre-defined building block of the second set of building blocks, wherein the building blocks of the second set of building blocks are configured such that each building block may be coupled in a unique way to a pre-defined building block of the first set of building blocks or to a pre-defined building block of the second set of building blocks or to a pre-defined building block of the third set of building blocks and wherein the building blocks of the third set of building blocks are configured such that each building block may be coupled in a unique way to a pre-defined building block of the third set of building blocks or to a pre-defined building block of the second set of building blocks.

Standardization is achieved by a pre-definition of the building block interfaces. Thus, it is ensured that for example only very specific combinations of building blocks may be realized at all. Since a closed modular design system is used, not only an efficiency guarantee can be given, moreover, a forecast of the expense for the energy costs of the data center is possible.

Using the concept of different kinds of cells, namely central cell, supply cell and server cells, a respectively individual scaling of the building blocks is possible.

A three step topology is provided wherein one or a plurality of central cells is superordinated to the supply cells and these in turn operate one or a plurality of server cells.

Further, it is possible that a supply cell is a constituent part of a server cell.

Computing power is essentially managed in a server cell. Moreover, the necessary infrastructure supply paths are maintained, namely for current, cooling, network connection and safety technique which are provided by the supply cells. Communication with the outer environment is realized via the central cells, i.e. power input, refrigeration, telecommunication connection and the like. According to the Tier classification, one or a plurality of central cells can be provided.

The present invention provides substantially the first set of building blocks which includes at least a framework or a rack, at least a double bottom section having an integrated air conditioning device and at least one partly partitioned aisle having a double bottom section or having double bottom sections. In the invention, the double bottom sections are consistently used for accommodating components, such as for examples air conditioning devices, so that no floor space is wasted on the effective area of servers. Other components may be contained in the first set of components.

In the invention, the double bottom section is already equipped with an integrated air conditioning device, where the enclosure is further preferably designed such that it supports the desired air guidance. Air guidance with minimum deflections is optimal in order to avoid undesired pressure losses.

According to a further preferred embodiment, the second set of building blocks includes at least one energy protection building block and at least one safety technique building block. By the pre-defined interfaces of the building blocks it is ensured that a building block fitting to the selected configuration of the server cells with regard to power, function and optionally other parameters is chosen.

The third set of building blocks includes, according to a preferred embodiment of the invention, at least a cold generation building block, at least one power feeding building block, at least one power main distribution building block and at least one network building block which may support an active or passive network. Also here it applies that based on pre-defined interfaces only that building block may be selected which is fitting the configuration of the supply cells.

BRIEF DESCRIPTION OF THE DRAWINGS

The invention will be explained in detail below with the aid of the appended drawing. It is shown in:

FIG. 7b a second example of a cooling circuit system for server cells to be cooled;

DETAILED DESCRIPTION OF THE INVENTION

Figure 1:
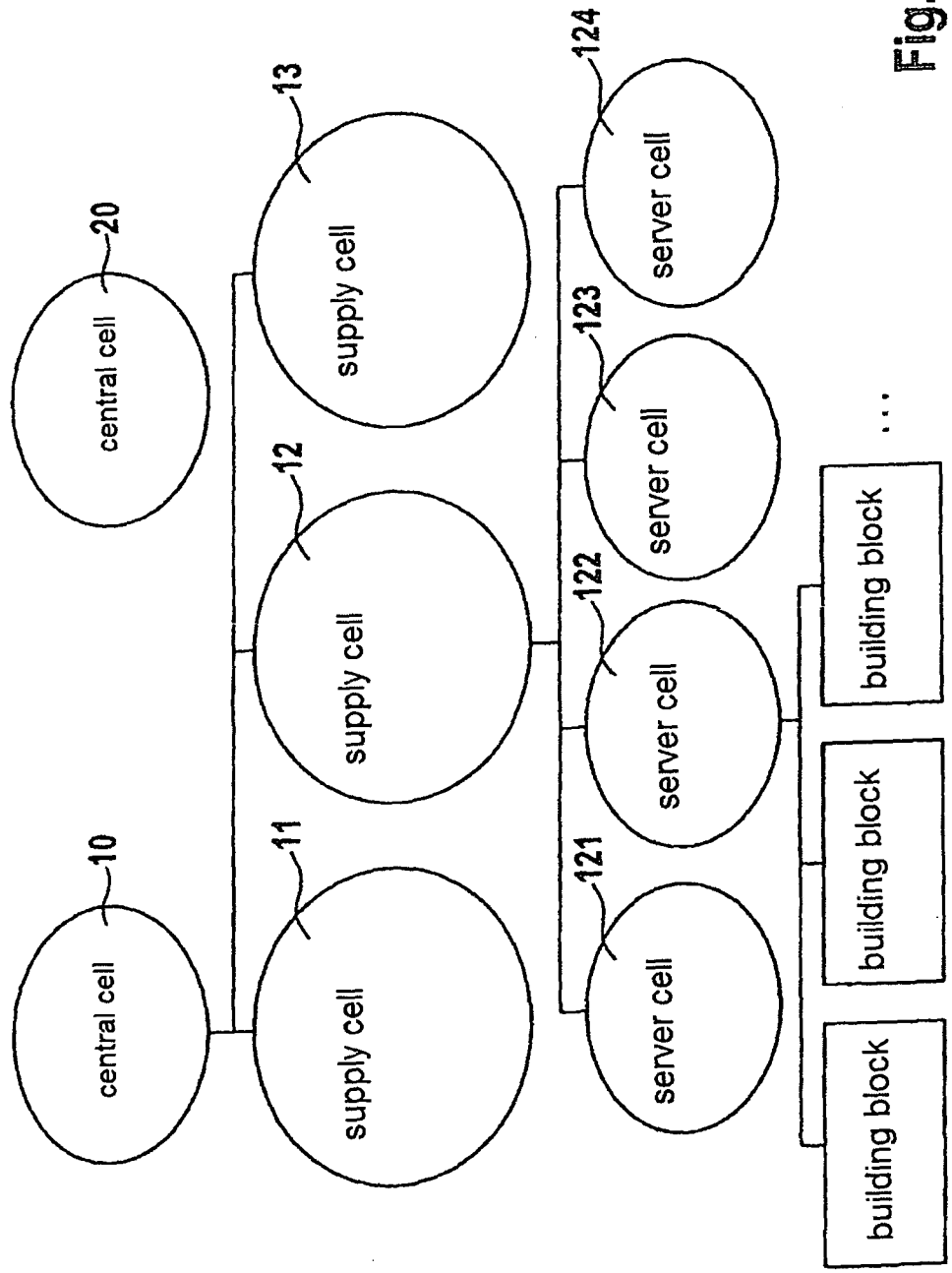
FIG. 1 an example of a data center topology which is created by the modular design principle according to the present invention.
Figure 2:
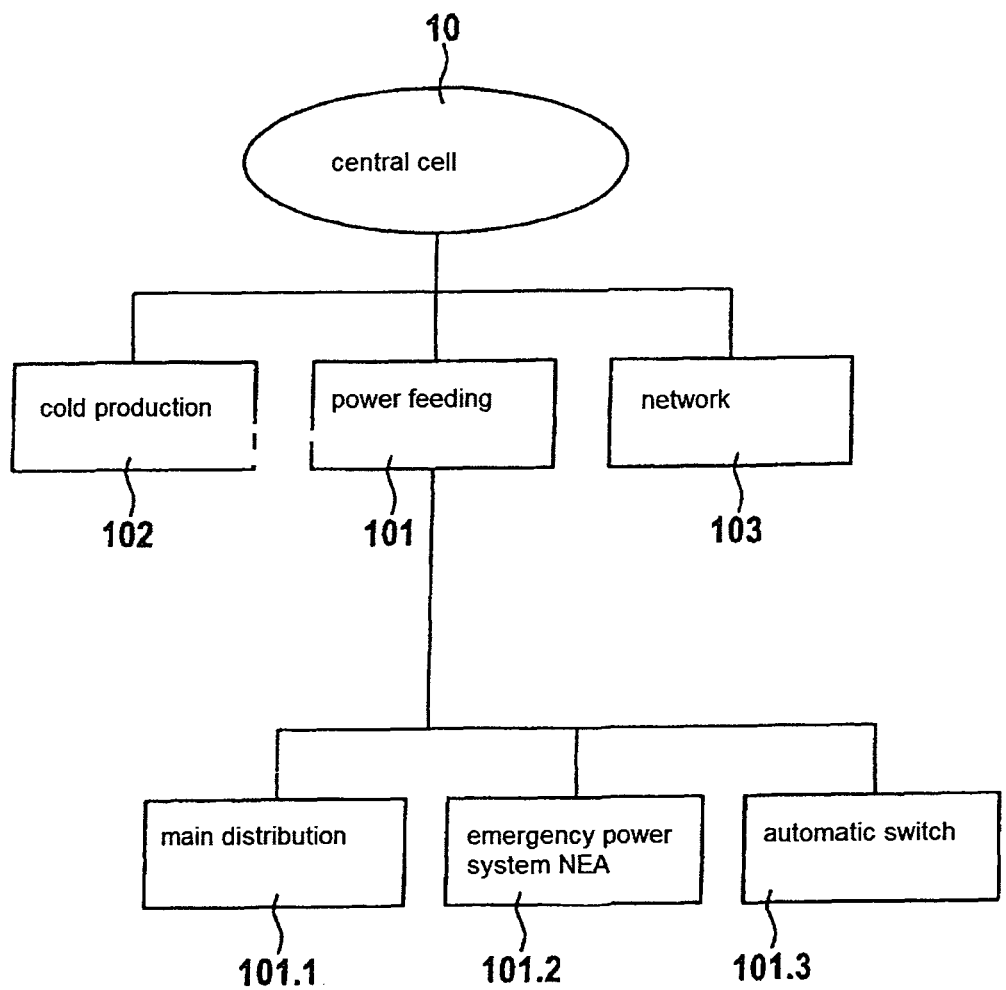
FIG. 2 a schematic illustration of exemplary building blocks in a central cell of the topology.

FIG. 1 shows an example of a topology of a data center built up according to the modular design principle and wherein a cooling circuit system according to the present invention is used. The topology provides three levels, namely a first level of central cells 10, 20, a second level of supply cells 11, 12, 13 and a third level of server cells 121, 122, 123, 124. As indicated for server cell 122, each cell is built by building blocks as explained in detail below. In the illustrated topology are provided, in an exemplary manner, two central cells 10, 20, the precise number of central cells is set according to the striven Tier classification. Communication with the outer environment is realized by those central cells 10, 20. This relates to power feeding, cold production, telecommunication connection and the like. In the illustrated embodiment, three supply cells 11, 12, 13 are subordinated to central cell 10. Supply cells are regularly also subordinated to central cell 20, however, are not illustrated here. Supply cells provide power protection and sub-distribution, cooling distribution and safety technique for server cells. This is illustrated schematically with exemplary reference to supply cell 12 where four server cells 121, 122, 123, 124 are subordinated and which are served by it. Accordingly, supply cells 11, 12 may serve one or a plurality of server cells, which, however, is not shown in the Figure. In a server cell, for example, for example server cell 121, 122, 123, 124, the computing power of the data center is essentially managed. The necessary infrastructure supply paths for power, cooling, network, safety, are maintained in each server cell. As exemplarily illustrated for server cell 122, it consist of one or of a plurality of building blocks. Also supply cells, such as supply cells 11, 12, 13, are built up of building blocks. The same is valid for central cells, such as central cells 10, 20. This is illustrated in FIG. 2.

Building blocks of a central cell 10 are essentially power feeding 101, cold production 102 and network 103. Power feeding 101 in turn is divided into main distribution 101.1, in particular low voltage main distribution (NSHV), emergency power system (NEA) 101.2 and an automatic switch 101.3 for selecting different power sources.

Figure 3:
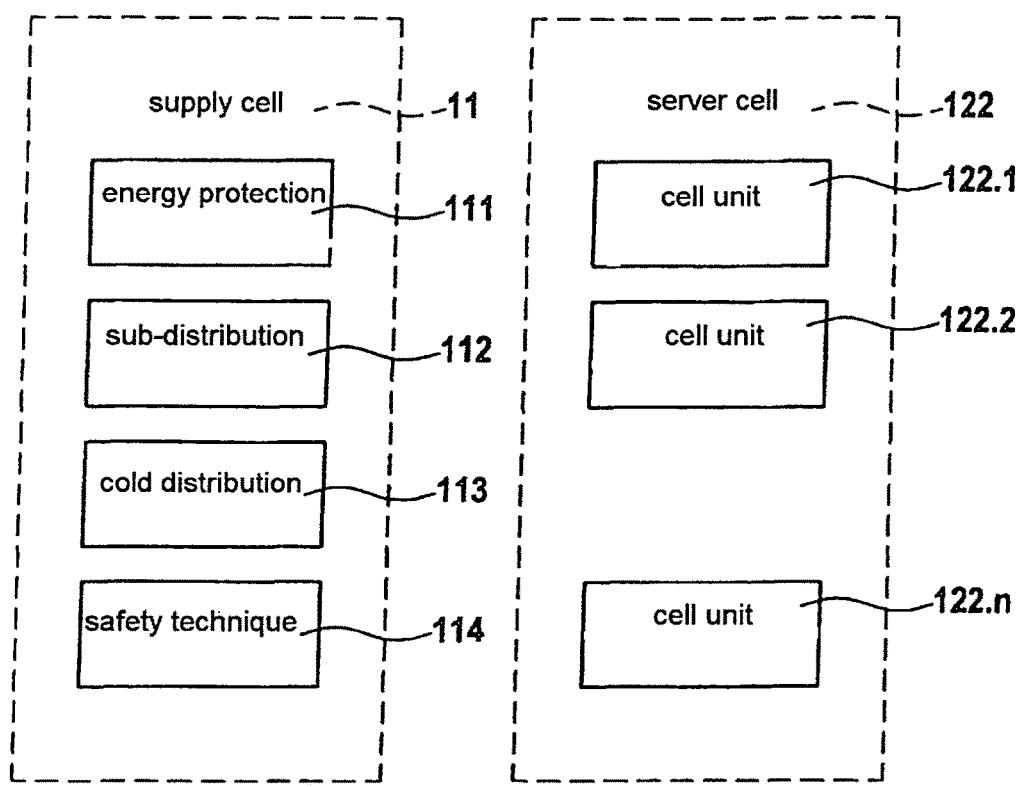
FIG. 3 a schematic illustration of exemplary building blocks of a supply cell and a server cell of the topology.

As illustrated in FIG. 3, the building blocks of a supply cell 11 are substantially energy protection 111, sub-distribution 112, cold distribution 113 and safety technique 114, such as e.g. fire safety. Energy protection is ensured by an uninterruptable power supply (USV) which is used to supply power to server cells or cell units, respectively, in case of disorders of the standard electricity network. A USV may compensate for local variations and failures by feeding connected devices with electrical energy from accumulators which are permanently charged from the standard electricity network. Building block sub-distribution 112 ensures supply of the cell units by the standard electricity network and by the USV network, wherein the racks of each cell unit are served in a steliform manner. A server cell 121 consists of a cell unit or of a plurality of cell units, such as cell units 122.1, 122.2, . . . 122.n. Each cell unit 122.1, 122.2, . . . 122.n forms a building block of a server cell 122 and is itself built up of building blocks, namely of one or of a plurality of server racks, an aisle or an aisle section which may also be partially partitioned, as well as of at least a double bottom plate which is optionally equipped with an air conditioning device. A supply cell may for example serve three cell units of a server cell.

Figure 4:
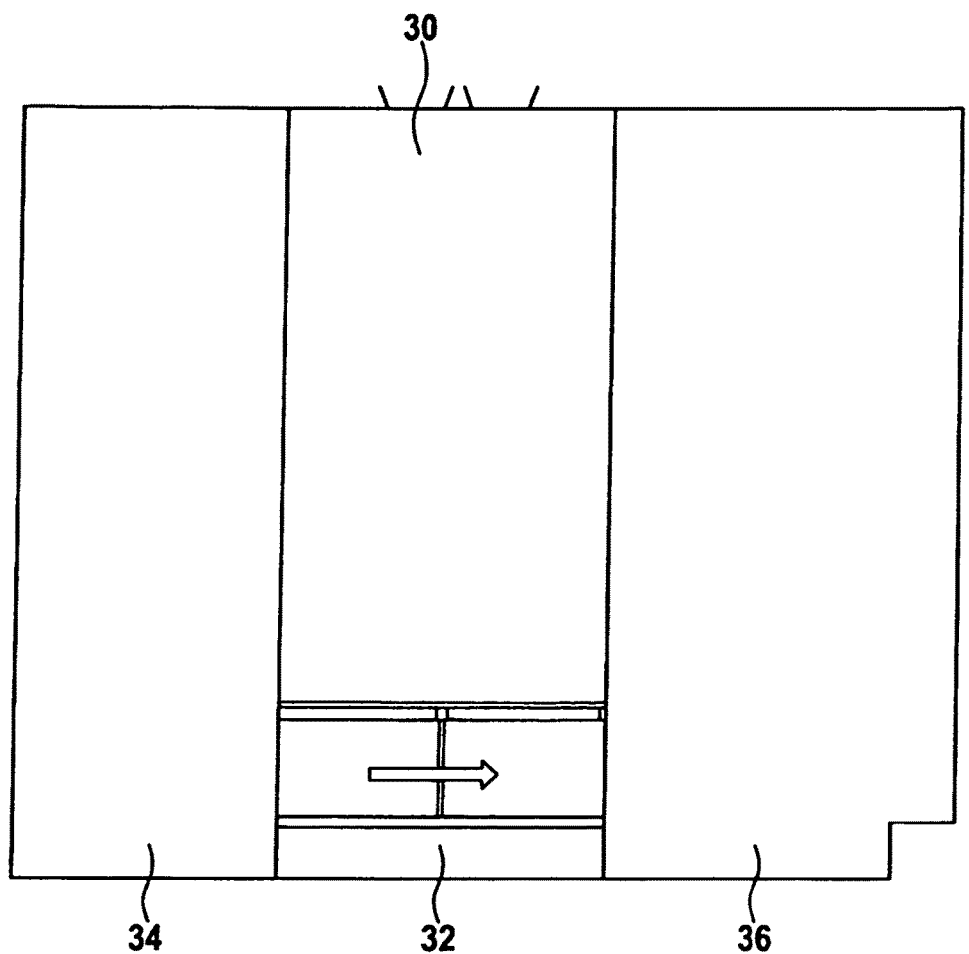
FIG. 4 an example of a cell unit of a server cell in a side view.

FIG. 4 shows an example of a cell unit of a server cell in a side view. Central building block of the cell unit is a rack 30 which is mounted on another building block, a double bottom element 32 with air conditioning device. This arrangement is laterally confined by a third building block, consisting of a (hot) aisle 34 and a double bottom section and an opposite building block, namely a (cold) aisle 36 with double bottom section. Hot aisle 34 and cold aisle 36 are partitioned so that cool inlet air and hot outlet air are strictly separated from another.

Figure 5:
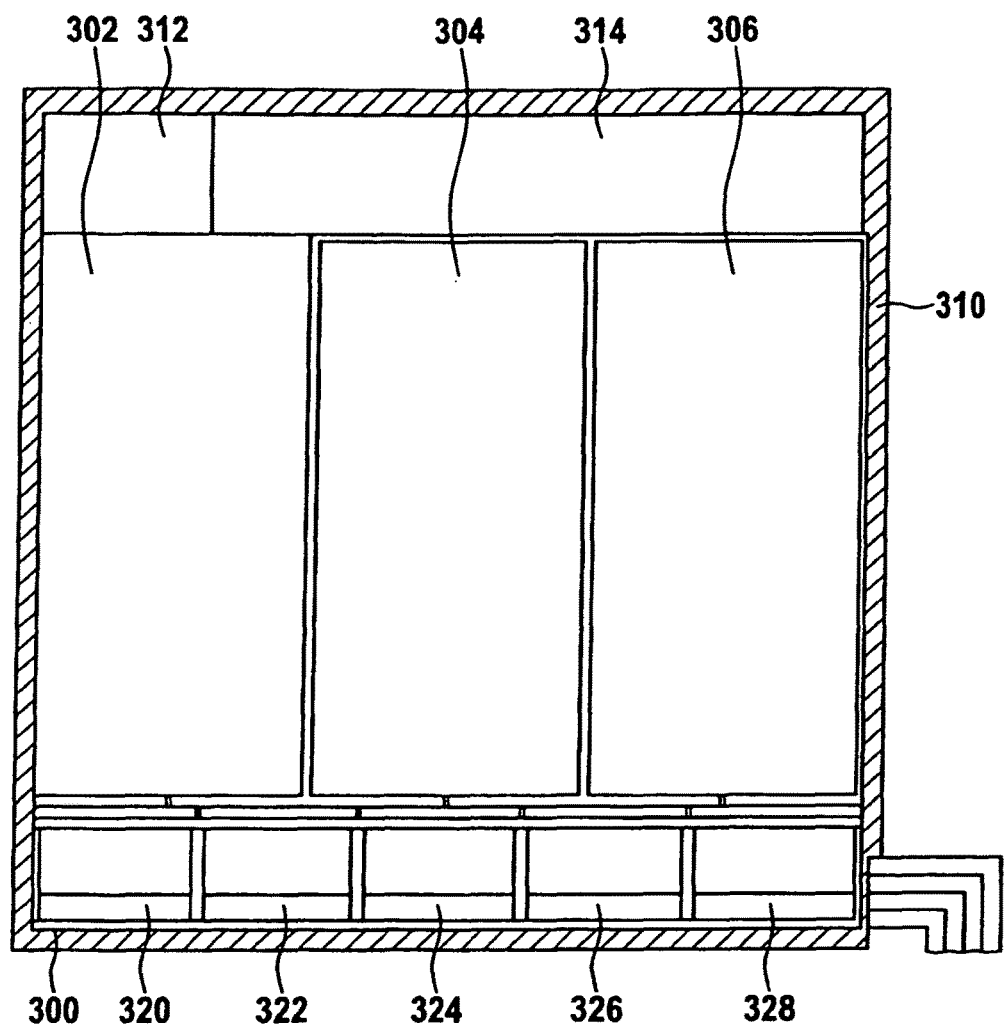
FIG. 5 an example of a cell unit of a server cell with associated supply cell in a front view.

FIG. 5 shows an example of a cell unit of a server cell with associated supply cell in a front view. The illustrated cell unit consists of three juxtaposed racks 302, 304, 306 which are mounted on double bottom elements 320, 322, 324, 326 and 328 on a base bottom 300. A rack serves, for example, to accommodate two 19" levels of 47 height units (HU) each. The pitch of the racks 302, 204, 306 is greater than the pitch of double bottom elements 320, 322, 324, 326, 328. On racks 302, 304, 306 a power distribution building block 312 as well as a network building block 314 are arranged. Thus, electric and electronic components are clearly separated above air conditioning devices in double bottom elements 320, 322, 324, 326, 328, which may possibly include water, so that leakage problems due to exiting fluid is mostly prevented. The cell unit can be enclosed by another building block, namely a protective cover 310.

Figure 6:
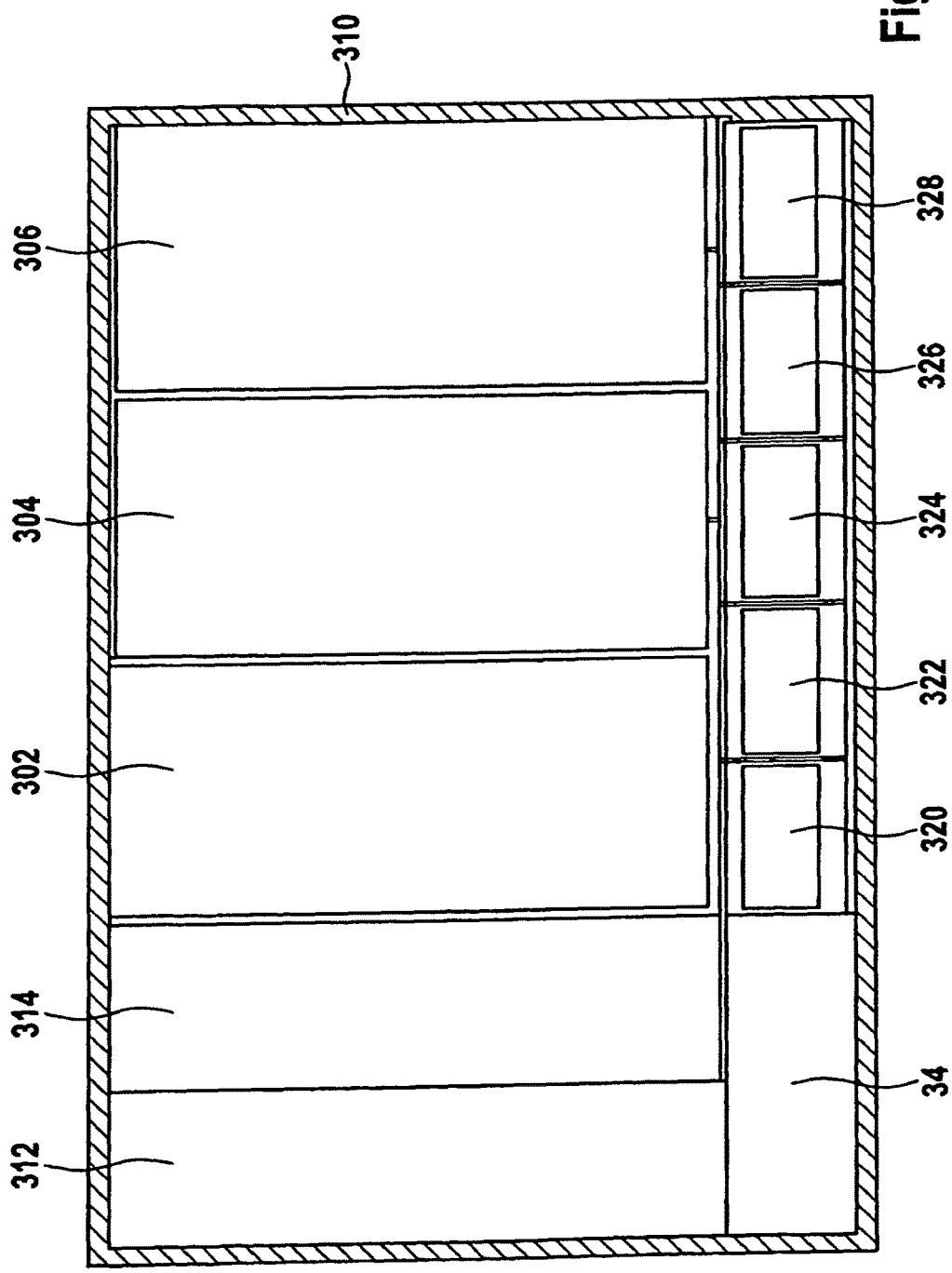
FIG. 6 another example of a cell unit of a server cell with associated supply cell.

FIG. 6 illustrates another example of a cell unit of a server cell with integrated supply cell. The cell unit is, as in the example of FIG. 4, composed of three juxtaposed racks 302, 304, 306, which are mounted on five double bottom elements 320, 322, 324, 326, 328. Again, a rack may be configured according to the example of FIG. 5. One double bottom element or a plurality of double bottom elements may be equipped with an air conditioning device. Different from the example of FIG. 4 is the building block power distribution 312, which is, as well as building block network 314, not disposed above racks 302, 304, 306, but adjacent to rack 302, but in turn physically separated from double bottom sections 320, 322, 324, 326, 328 so that leakage problems therein will not be transferred to the electric and electronic components. Power distribution 312 and network 314 close an aisle 34 with double bottom section. The cell unit may be enclosed by a further building block, namely a protective cover 310.

Individual building blocks will be exemplarily described below by means of parameters and functions.

A mounting frame or rack serves to accommodate server and storage systems and has, for example, a capacity of 2×42 HU, wherein dimensions of e.g. 2×(600×2000×1000 mm³), but also other configurations are conceivable. A lateral partitioning may be provided. Power connection, for example 30 kW, an A&B supply (A: standard electricity network, B: USV network) as well as contact sockets are provided as interfaces, which can be optionally measured and switched. Control of air conditioning is made by suitable electronics and software, where suitable command variables, such as server inlet air temperature or difference pressures, may be chosen.

Cooling of one or a plurality of racks loaded with servers is made by an air conditioning device pre-assembled in a double bottom element, for example a water-water heat exchanger with pump. It may for example be designed to deliver a cooling power of 60 kW. As interfaces, for example a cold water supply having an inlet temperature of 18° C. and a return connection for hot water are provided, further an electric terminal of 1.8 kW. Controlling is achieved by monitoring temperatures, rotational speeds and flow volumes, rotational speed and flow volume are then controlled to maintain a desired temperature.

Air conditioning is an essential constituent part of a data center. A conventional data center typically has a ratio of useful area to support area of about 60:40. This ratio is substantially determined by the air conditioning components disposed in the data center, such as for example CRAC units or LCPs (Liquid Cooler Packages) which are disposed adjacent to or between the loaded racks and thus require area which should be used by servers. By consequently placing the necessary cooling components, such as heat exchangers, humidification and dehumidification devices, if insofar required according to the invention, as well as fans and controlling in regions where servers will not be mounted, for example in the double bottom, the ratio which was unfavorable until now is significantly shifted in favor of the usable server area and reaches for example a ratio of 80:20. Humidification and dehumidification devices are optionally associated with the cold production, i.e. a central place. Consistent separation of hot and cold air, combined with intelligent control, are basic preconditions to realize highest cooling loads and efficiencies. All components are uncompromisingly arranged at an optimal place in the cooling circuit of the data center following physical considerations.

Following the modular design principle, double bottom elements may for example include simple blowers or fans, respectively, for example inexpensive axial fans which actively direct the air flow to a server cell or cell unit. Furthermore, a heat exchanger may be integrated into a double bottom section which in particular is obliquely arranged so that the volume of the double bottom section is used to maximize the area of the heat exchanger and consequently the cooling power thereof. The pressure loss of the heat exchanger is, due to its dimensions, so low that fans existing in the servers are capable to overcome this additional air pressure drop, which combines with highest energy efficiency, since no additional electrical power for operating separate fans in the double bottom is required.

Figure 7A:
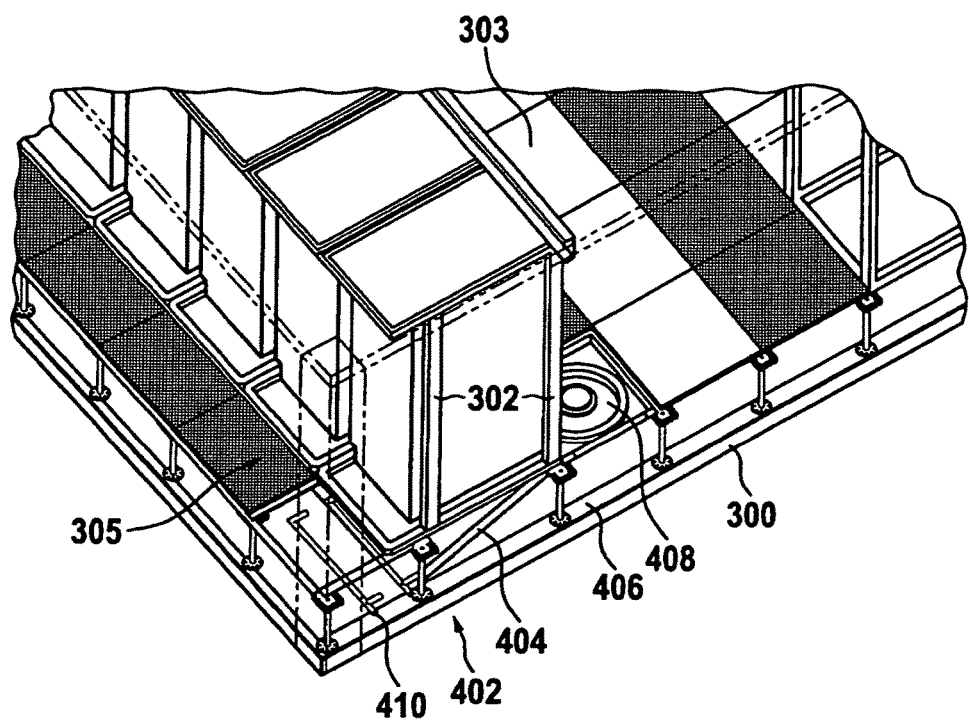
FIG. 7a a first example of a cooling circuit system for server cells to be cooled at a cold aisle.

FIG. 7a illustrates a first example of a cooling circuit system for server cells to be cooled at a cold aisle. A server cell, consisting of for example six racks 302 which are loaded with electric or electronic components, such as servers and relevant equipment, is mounted on a double bottom 300 comprising double bottom elements 402, 406. Optionally, a mirror version is opposed to that server cell, so that a partitioned cold aisle 303 is formed between them. Hot air exiting rack 302 is guided into a double bottom element 402 which includes an obliquely arranged heat exchanger 404, from base bottom 300 to close to a rack 302, as well as associated piping 410. Double bottom element 402 is arranged such that heat exchanger 404 is immediately below the server cell or rack 302, respectively. By this measure, additional protection from mechanical damages from top is achieved. Piping 410 for heat exchanger 404 is located in the region of the hot aisle which is for example closed against a building wall or container wall. Air which was cooled by heat exchanger 404 is conveyed into cold aisle 303 by means of axial fan 408 arranged in double bottom element 406 and is then again available for cooling the electric or electronic components. Cooling air flow is so to say "from the front to the rear" through racks 302.

Another example of an optimized cooling circuit system is illustrated in FIG. 7b. A server cell, consisting of rack 302 which is loaded with servers and relevant equipment is built up on a base bottom 300, further, a partitioned cold aisle 303 is provided as a further building block. A mirror version with rack 302' and partitioned cold aisle 303' is arranged oppositely. Hot air exiting from the racks 302 and 302' or servers installed therein, respectively, is guided in a respective double bottom element 402, 402' with integrated obliquely arranged heat exchanger 404, 404' which in this embodiment is located in the region of hot aisle 305, 305', which heat exchangers cool down the hot air and convey it within the double bottom to another double bottom element 406 with integrated axial fan 408 which now in turn feeds cool air into cold aisle 303, 303'.

Figure 8:
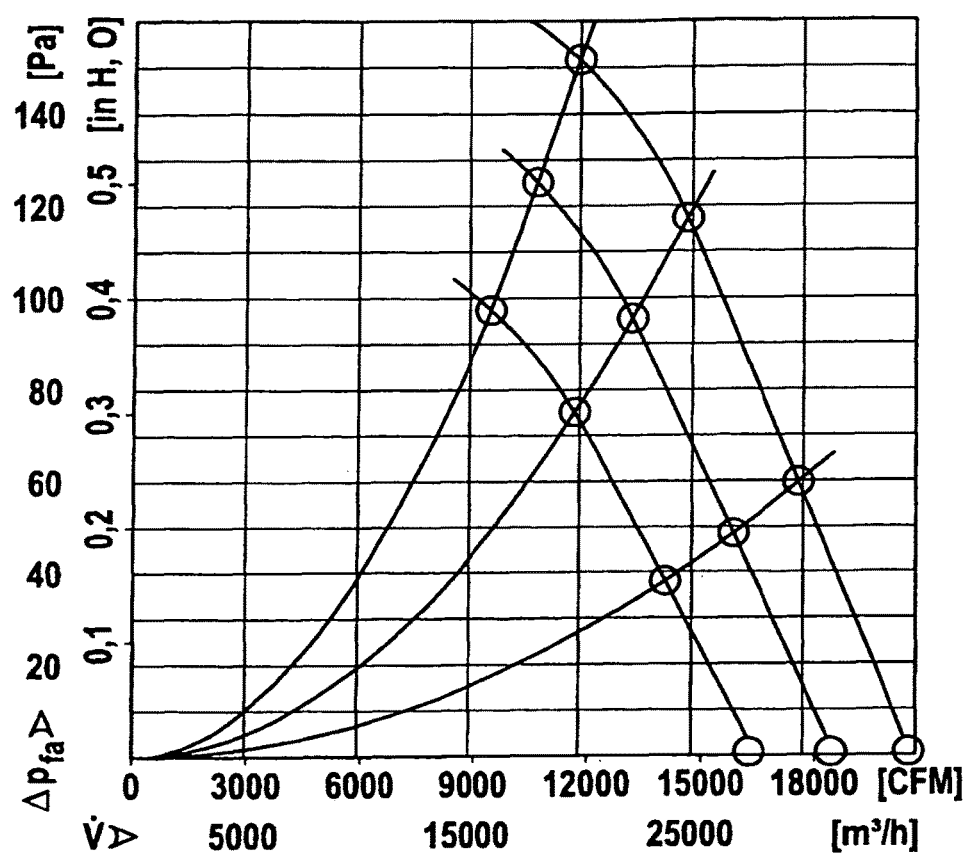
FIG. 8 an example of fan and device or system characteristics, respectively, for determining the air performance.

FIG. 8 shows an example of fan and device and system characteristics for determining the air performance. The volume flow is plotted on the abscissa, pressure increase on the ordinate. Fan characteristics are given in data sheets, they are measured by the manufacturer on a fan test station. According to the mounting position, actual characteristics may deviate. In FIG. 8, the fan characteristics for different fan performances are designated with A, B, and C. Device and system characteristics D, E, F may be determined by numeric simulation. The operating point of the fan system is the section of fan and device or system characteristics. In operation, the fan system creates a pressure increase which exactly compensates for the pressure loss in the system. For a smaller flow resistance of the system, a substantially greater volume flow may be produced with such a fan system, compared to a system having a high flow resistance. By optimized air flow conveyance of the cooling circuit system of the present invention, the advantages of a fan in parallel operation can be used. Since n parallel connected (identical) fans in an ideal case will create the n-fold volume flow, they can be operated at low numbers of revolution which has favorable impact on the power consumption of the fan system.

Figure 9:
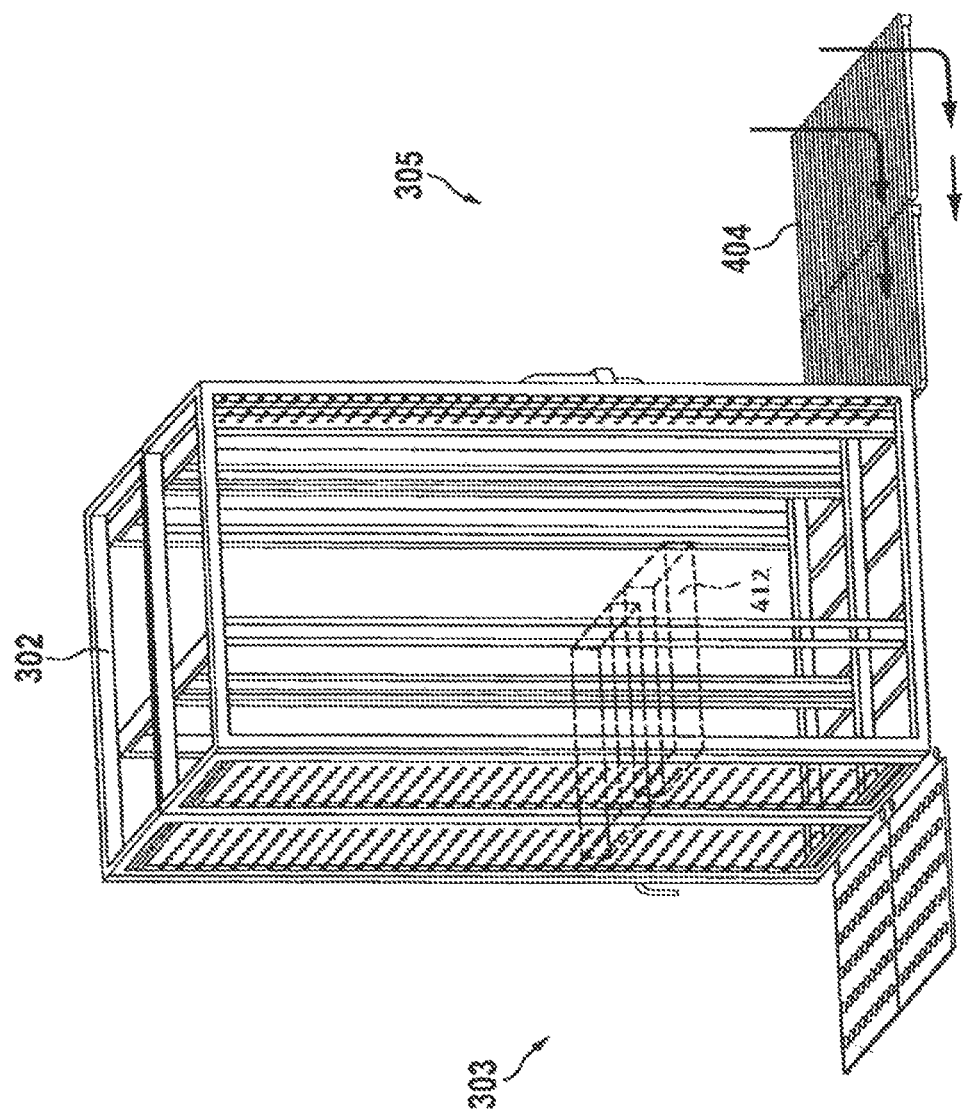
FIG. 9 an example of a cooling circuit system without fan in the double bottom.

Standardizing of the building blocks according to the present invention allows a modification that the fan of a server itself ensures the required air conveyance. Such situation is schematically illustrated in FIG. 9. No fans are present in the double bottom elements of cold aisle 303, circulation is provided exclusively by fans 410 of server components (not illustrated) conveying the air through racks 302 into hot aisle 305 so that it may be cooled down by heat exchanger 404. Even hybrid solutions are possible where air conveyance is ensured both by fans in the double bottom and by fans 412 of the servers.

Topology of a data center according to the present invention can be modeled by software. Software for efficiency considerations is available. Consequently, planning may be standardized and can be performed automatically. Simultaneously, cost planning is possible which does not only include investment cost but also operating expenses which result from the efficiency analysis.

The individual building blocks in their admissible combination may be certified in advance, so that respective waiting periods in a completed data center are omitted.

Figure 10:
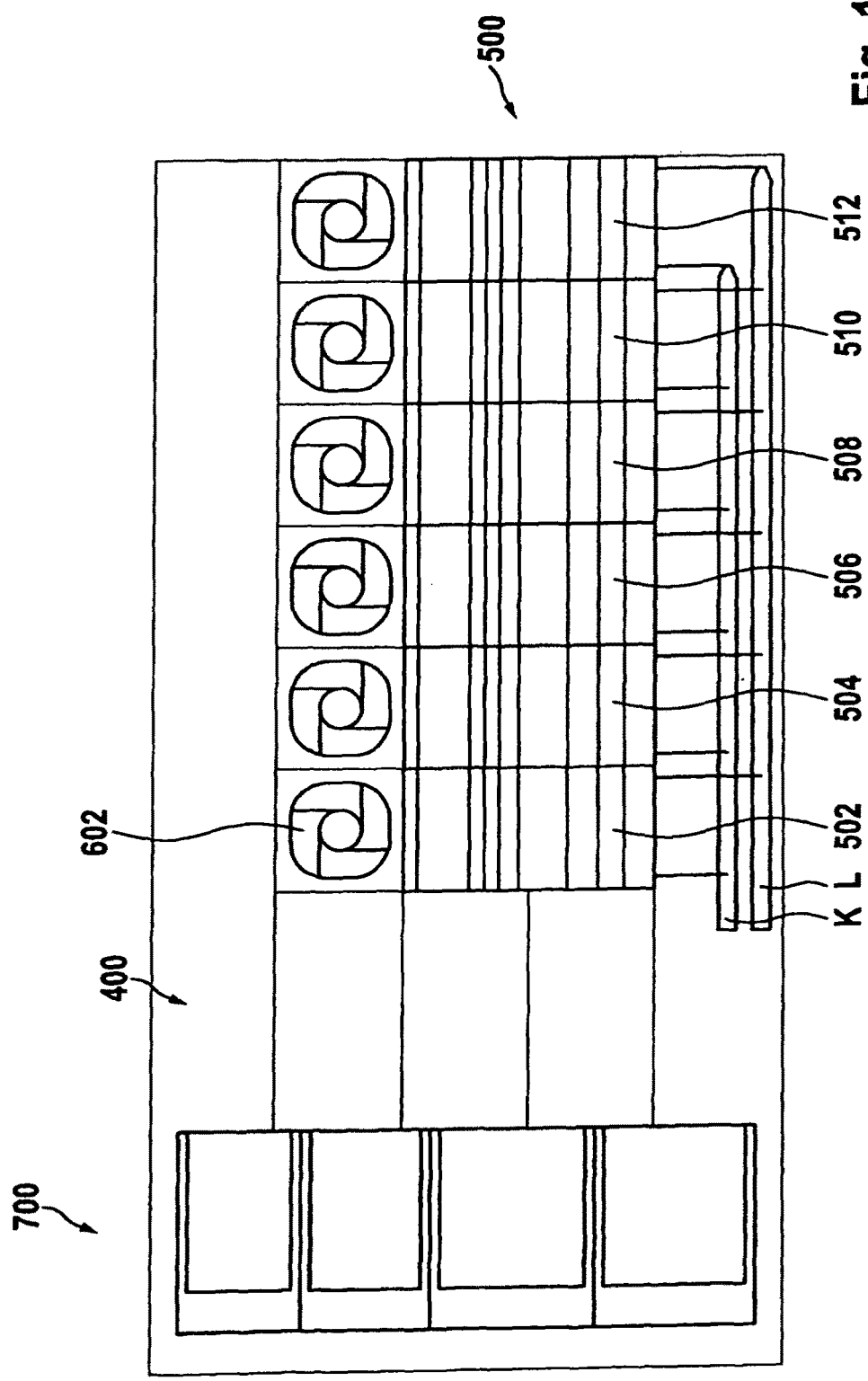
FIG. 10 an example of a layout of a data center accommodated within a container.
Figure 11A:
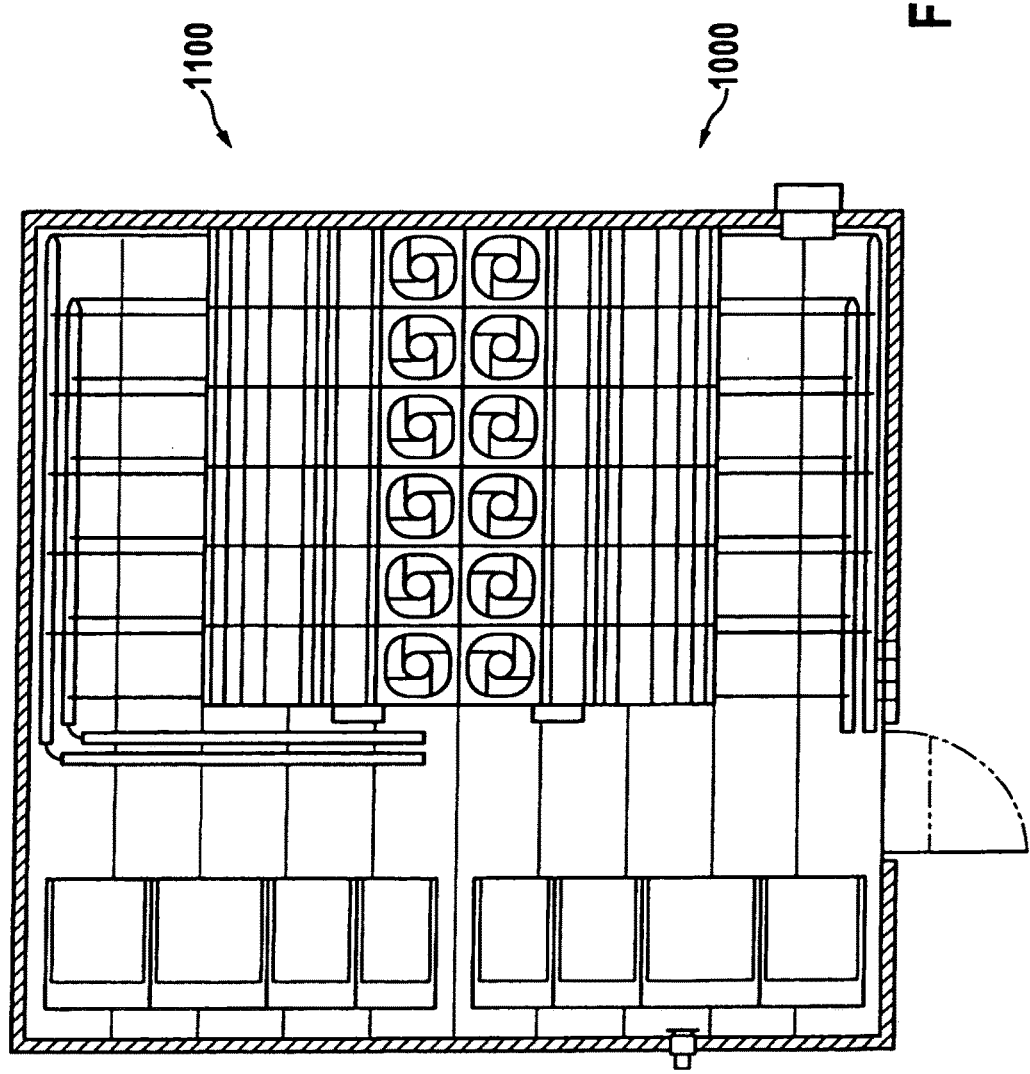
FIG. 11a, 11b a sectional view and a perspective view of another example of a container data center.
Figure 11B:
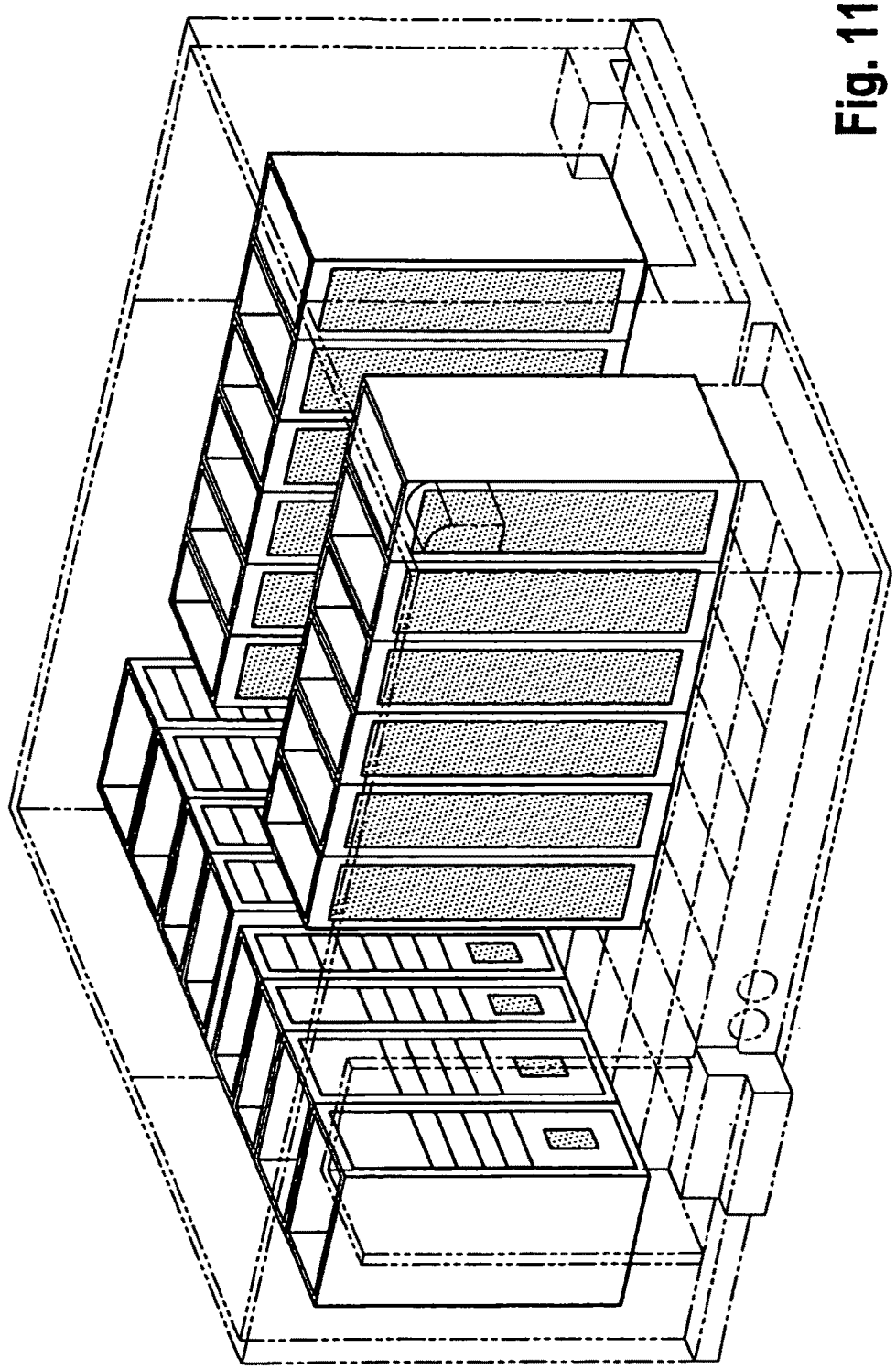

The invention allows in a most simple manner a new construction or expansion of data centers by scaling and/or exchange of existing building blocks with other ones having a compatible interface, but higher or even lower power. A data center according to the present invention may even totally or partly be built up in a container, an exemplary layout is illustrated in FIG. 10. Six cell units 502, 504, 506, 508, 510, 512 of a server cell 500 are juxtaposed on a double bottom 400 comprised of double bottom sections. Each of the cell units, for example 502, is associated with a double bottom section 602 with integrated fan. Cold water ducts K and hot water ducts L are also guided within double bottom 400. A central cell and a plurality of supply cells are accommodated at 700. There is no substantial need to close the containers, a larger computer space may be achieved by a combination of two containers which are open at a respective connecting side, as it is shown in FIG. 11a in a sectional view, and in FIG. 11b in a perspective view. The layout of each computer half space 1000, 1100 corresponds, except for piping or cable routing, substantially that of FIG. 10 or a mirror image thereof.

Consequently, the invention provides, by a clearly defined number of tested building blocks and a simple definition which building blocks can be combined, the possibility to build up a data center flexibly according to customer request.

The features of the invention disclosed in the above description, in the drawings and in the claims may be both individually or in any combination thereof be material for realizing the invention.

The invention claimed is:

1. A cooling circuit system, comprising:
   a double bottom consisting of double bottom elements mounted on a base bottom;
   a plurality of juxtaposed racks mounted on the double bottom;
   electric or electronic components to be cooled, in which the electric or electronic components to be cooled are accommodated in the plurality of juxtaposed racks; and
   a cooling system comprising fans which blow cooled air from the double bottom;
   wherein the components of the cooling system, including the fans, are exclusively accommodated in the double bottom, wherein at least a portion of the fans are identical to each other and are physically connected in parallel to each other in the air flow and operate with identical revolutions to multiply the air flow of the cooled air towards the juxtaposed racks,
   wherein the cooling airflow through the racks and over the components is only supplied by the fans of the cooling system.

2. The cooling circuit system of claim 1, wherein the plurality of juxtaposed racks separates a cold aisle from a hot aisle, and at least a portion of the double bottom elements are arranged in the cold aisle and the fans are arranged in the double bottom elements of the cold aisle.

3. The cooling circuit system of claim 1, wherein the fans are axial fans.

4. The cooling circuit system of claim 2, wherein the cooling system comprises at least one heat exchanger which is accommodated in one of or in a plurality of the double bottom elements below at least one of the racks or in at least a portion of the double bottom elements of the hot aisle.

5. The cooling circuit system of claim 2, wherein a heat exchanger is obliquely arranged in one of or in a plurality of the double bottom elements of the hot aisle such that a transversely extending edge of the heat exchanger is positioned close to the lowermost portions of the plurality of juxtaposed racks and the opposite transversely extending edge is positioned close to the base bottom.

6. The cooling circuit system of claim 4, wherein the at least one heat exchanger are water-water heat exchangers.

7. The cooling circuit system of claim 4, wherein the piping for the at least one heat exchanger is accommodated in the double bottom elements of the hot aisle.

8. The cooling circuit system of claim 1, wherein at least a portion of the double bottom elements is designed as a covered frame in which at least one of the components of the cooling system is pre-assembled.

9. A method of controlling the cooling system in the cooling circuit system of claim 1, wherein the performance of the fans is controlled such that the air flow volume in the cooling system corresponds to the air flow volume around the plurality of juxtaposed racks.

10. A cooling circuit system for use in a data center, comprising:
  a double bottom consisting of double bottom elements mounted on a base bottom;
  a plurality of juxtaposed racks mounted on the double bottom;
  electric or electronic components to be cooled, in which the electric or electronic components to be cooled are accommodated in the plurality of juxtaposed racks; and
  a cooling system comprising fans which blow cooled air from the double bottom;
  wherein the components of the cooling system, including all of the cooling fans, are disposed within the double bottom, wherein at least a portion of the fans are connected physically in parallel in the air flow and thus operate together to at least double the air flow of the cooled air towards the juxtaposed racks, and
  wherein the cooling airflow through the racks and over the components is only supplied by the fans of the cooling system.

11. The cooling circuit system according to claim 10, wherein the at least a portion of fans connected in parallel are identical to each other, and comprise "n" parallel connected fans to create an essentially "n"-fold increase in volume flow.

12. The cooling circuit system according to claim 11, wherein "n" is >2.

13. The cooling circuit system according to claim 1, wherein the at least a portion of identical fans connected in parallel comprise "n" parallel connected fans to create an essentially "n"-fold increase in volume flow.

14. The cooling circuit system according to claim 13, wherein "n" is >2.

15. The cooling circuit system of claim 2, wherein the cold aisle and the hot aisle are partitioned to separate cool inlet air from hot outlet air.

\* \* \* \* \*